(12) United States Patent
Strzyzewski et al.

(10) Patent No.: US 8,906,456 B2
(45) Date of Patent: Dec. 9, 2014

(54) APPARATUS AND METHOD FOR HIGH-THROUGHPUT CHEMICAL VAPOR DEPOSITION

(71) Applicant: Aixtron Inc., Sunnyvale, CA (US)

(72) Inventors: Piotr Strzyzewski, Herzogenrath (DE); Peter Baumann, Aachen (DE); Marcus Schumacher, Kerpen-Blatzhelm (DE); Johannes Lindner, Roetgen (DE); Antonio Mesquida Küsters, Baesweiler (DE)

(73) Assignee: Aixtron, Inc., Sunnyvale, CA (US)

( * ) Notice: Subject to any disclaimer, the term of this patent is extended or adjusted under 35 U.S.C. 154(b) by 0 days.

(21) Appl. No.: 14/038,669

(22) Filed: Sep. 26, 2013

(65) Prior Publication Data

US 2014/0030434 A1 Jan. 30, 2014

Related U.S. Application Data

(62) Division of application No. 11/573,325, filed as application No. PCT/EP2005/053134 on Jul. 1, 2005.

(30) Foreign Application Priority Data

Aug. 6, 2004 (DE) .......... 10 2004 038 539
Nov. 20, 2004 (DE) .......... 10 2004 056 170

(51) Int. Cl.
*C23C 16/458* (2006.01)
*C23C 16/455* (2006.01)
*B05C 3/18* (2006.01)
*B05D 1/36* (2006.01)

(52) U.S. Cl.
CPC ......... *C23C 16/458* (2013.01); *C23C 16/45551* (2013.01); *B05C 3/18* (2013.01); *B05D 1/36* (2013.01)
USPC ....................... 427/248.1; 427/251

(58) Field of Classification Search
None
See application file for complete search history.

(56) References Cited

U.S. PATENT DOCUMENTS

| | | | |
|---|---|---|---|
| 6,821,563 B2* | 11/2004 | Yudovsky | 427/248.1 |
| 2005/0084610 A1* | 4/2005 | Selitser | 427/248.1 |
| 2005/0268852 A1* | 12/2005 | Hatanaka et al. | 118/723 VE |
| 2006/0177579 A1* | 8/2006 | Shin et al. | 427/248.1 |

* cited by examiner

*Primary Examiner* — Joseph Miller, Jr.
(74) *Attorney, Agent, or Firm* — Ascenda Law Group, PC

(57) ABSTRACT

A device for depositing at least one especially thin layer onto at least one substrate includes a process chamber housed in a reactor housing and includes a movable susceptor which carries the at least one substrate. A plurality of gas feed lines run into said process chamber and feed different process gases which comprise layer-forming components. Said process gases can be fed to the process chamber in subsequent process steps, thereby depositing the layer-forming components onto the substrate. In order to increase throughput, the process chamber is provided with a plurality of separate deposition chambers into which different gas feed lines run, thereby feeding individual gas compositions. The substrate can be fed to said chambers one after the other by moving the susceptor and depositing different layers or layer components.

10 Claims, 6 Drawing Sheets

APPARATUS AND METHOD FOR HIGH-THROUGHPUT CHEMICAL VAPOR DEPOSITION

This application is a DIVISIONAL of U.S. application Ser. No. 11/573,325, filed 6 Feb. 2007, which is a national phase application of International Application PCT/EP2005/053134, filed 1 Jul. 2005, which claims priority to German Application No. 10 2004 038 539.4, filed 6 Aug. 2004 and German Application No. 10 2004 056 170.2, filed 20 Nov. 2004, all of which are incorporated herein by reference.

The present invention relates to an apparatus for depositing at least one in particular thin layer on at least one substrate, having a process chamber which is disposed in a reactor housing and has a movable susceptor which carries the at least one substrate, into which process chamber there opens out a plurality of gas feed lines for the introduction of process gases which are different from one another and contain layer-forming components, it being possible for these to be introduced into the process chamber in successive process steps in order for the layer-forming components to be deposited on the substrate.

The invention also relates to a method of depositing at least one in particular thin layer on at least one substrate in a process chamber which is disposed in a reactor housing, in which the substrate is carried by a movable susceptor and into which are introduced different process gases which contain layer-forming components which are deposited on the substrate in successive process steps.

Such an apparatus and such a method are known in the prior art. Different growth steps are carried out one after another in the chamber, the gas phase within the process chamber being purged and exchanged between the individual growth steps. Different gas-phase compositions are used for each of the different growth steps. Provision is also made here for different gases to be introduced into the process chamber on a cyclic basis in order for layer systems with recurring layer sequences to be deposited.

The advancement in electronic components, in particular for CMOS and DRAM applications, requires equivalently thinner dielectric films on increasingly large substrates. High-k dielectric materials are to replace SiO2. Possible candidates for these materials are, for example, materials containing aluminum oxide or hafnium oxide. However, these simple oxides are probably not capable of satisfying all the requirements they have to meet in respect of a high dielectric constant, namely a low leakage current density and a high thermal stability. For this reason, it would appear to be necessary to use more complex mixtures of these or similar metal oxides or dopings of these materials. It is also to be expected that polysilicon will be replaced by new materials as electrodes. Producing these material systems on an industrial scale requires a deposition method which is cost-effective, efficient in manufacture, highly reproducible and allows high-purity uniform films with precisely defined interfaces and also high conformality on structured substrates.

Conventional metal-organic chemical vapor deposition (MOCVD) has been used successfully for depositing films such as SiO2. In comparison with Atomic Layer Deposition (ALD), MOCVD is no longer suitable for depositing the new complex high-k layers uniformly in a thickness of 10 nm on small or large substrates. Furthermore, MOCVD does not achieve the higher level of conformality on structured substrates as is necessary. In ALD, different gaseous reactive substances are fed to the substrate alternately and repeatedly. This allows the deposition of mono layers based on alternating, self-limiting surface reactions. The alternating cycles, in which different gaseous reactants are directed into the reactor, are separated from one another by pumping steps and purging steps. This requires complicated switching and valve arrangements. The limited response time of the valves additionally results in delays. The pumping and purging cycles take up most of the process time without contributing to film growth itself. In many ALD reactors, the reactive gases flow parallel to the substrate surface, so that the growth rate decreases and longer cycle lengths are required. These features result in a low throughput, in particular for single-substrate ALD.

Furthermore, only a small number of precursors can be used as reactive materials for ALD. Many of these precursors are based on chlorine-containing substances. An ALD process based on such starting materials, for example, H2O as oxidizing agent, results in HCl being formed as a byproduct, which poses problems as far as gas disposal is concerned. Furthermore ALD methods which use solid-body sources do not usually reach the necessary level of gas-phase saturation. This also reduces the throughput of the system. The problem is multiplied in systems with more than one substrate and in large-scale reactors.

It is an object of the invention to develop the method of the generic type and the apparatus of the generic type in respect of a higher throughput on substrates.

The object is achieved by the invention specified in the claims, describing solutions which are autonomous and independent of one another but nevertheless also contribute to achieving the object in combination with each of the rest of the claims.

The process chamber has a plurality of deposition chambers which are separate from one another and into which different gas feed lines open out for the introduction of individual gas compositions, and to which the substrate can be conveyed successively by the movement of the susceptor, in order for different layers or layer components to be deposited there. The different process gases are introduced into deposition chambers of the process chamber which are separate from one another, and the at least one substrate is conveyed to the individual deposition chambers one after the other by the movement of the susceptor, and one of the process steps is carried out in each deposition chamber.

The invention thus relates to a method and an apparatus which compensate for one or more of the abovementioned problems of the prior art. In this system, the substrates are alternately exposed to different chambers which are filled with different gaseous reaction material. These chambers are preferably separated from one another by a dynamic gas-flow seal, so that mixing of the gases of adjacent chambers is significantly reduced. The gases are conducted to the substrates independently of one another. Combining this with a contact-free vaporization system and vaporization method using non-continuous injection of liquid or dissolved metal precursors into a heated volume, in order to convert the precursors into the gas phase and to feed them to the chambers of the reactor, allows a high level of gas-phase saturation. This can reduce the necessary amount of time within which the substrates are exposed to the gaseous reactants in each chamber, and can thus increase the throughput. As an alternative to this, the precursors may also be supplied with a high level of gas-phase saturation via continuous vaporization. Methods in this respect may use bubblers or other gas-delivery systems or methods. The precursors may be supplied to the process chamber using a combination of these apparatuses or methods.

The fact that an individual process gas is introduced continuously into the individual deposition chambers is considered to be a particular advantage of the invention. In contrast to the method and apparatus known from the prior art, there is no need for any gas exchange here; rather, the substrate is moved from one process step to the next. The individual process chambers can be heated. For this purpose, it is possible to heat the process-chamber top, which contains the deposition chambers in the form of chambers which are open in the direction of the substrate holder. It is even possible for each individual deposition chamber to be heated individually. It is also possible for the susceptor to be heated. The gas feed lines are preferably also temperature-controlled.

Exemplary embodiments of the invention are explained herein below with reference to accompanying drawings, in which.

Figure 1:
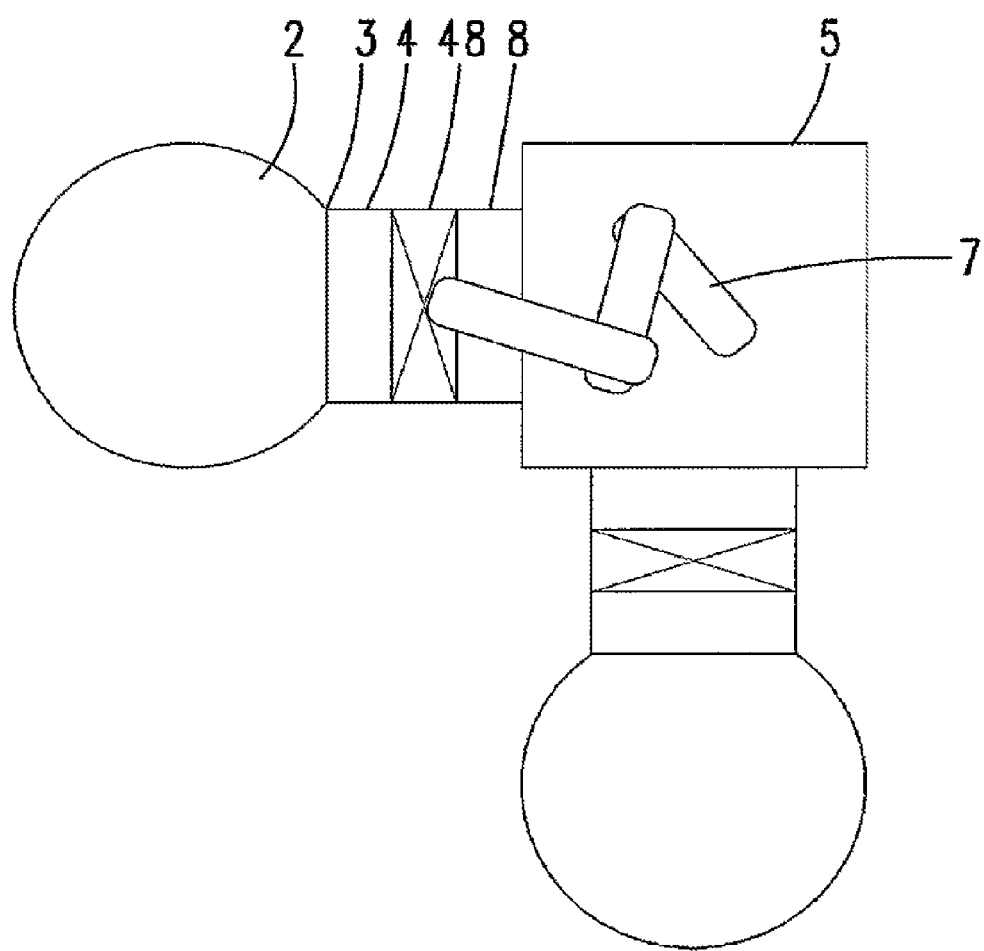
FIG. 1 shows a schematic illustration of the construction of a system with two vacuum chambers which are connected to a vacuum-transfer chamber containing a robot arm. It is also possible for a relatively large number of reactor housings to be connected to the transfer chamber and/or the vacuum system.
Figure 2:
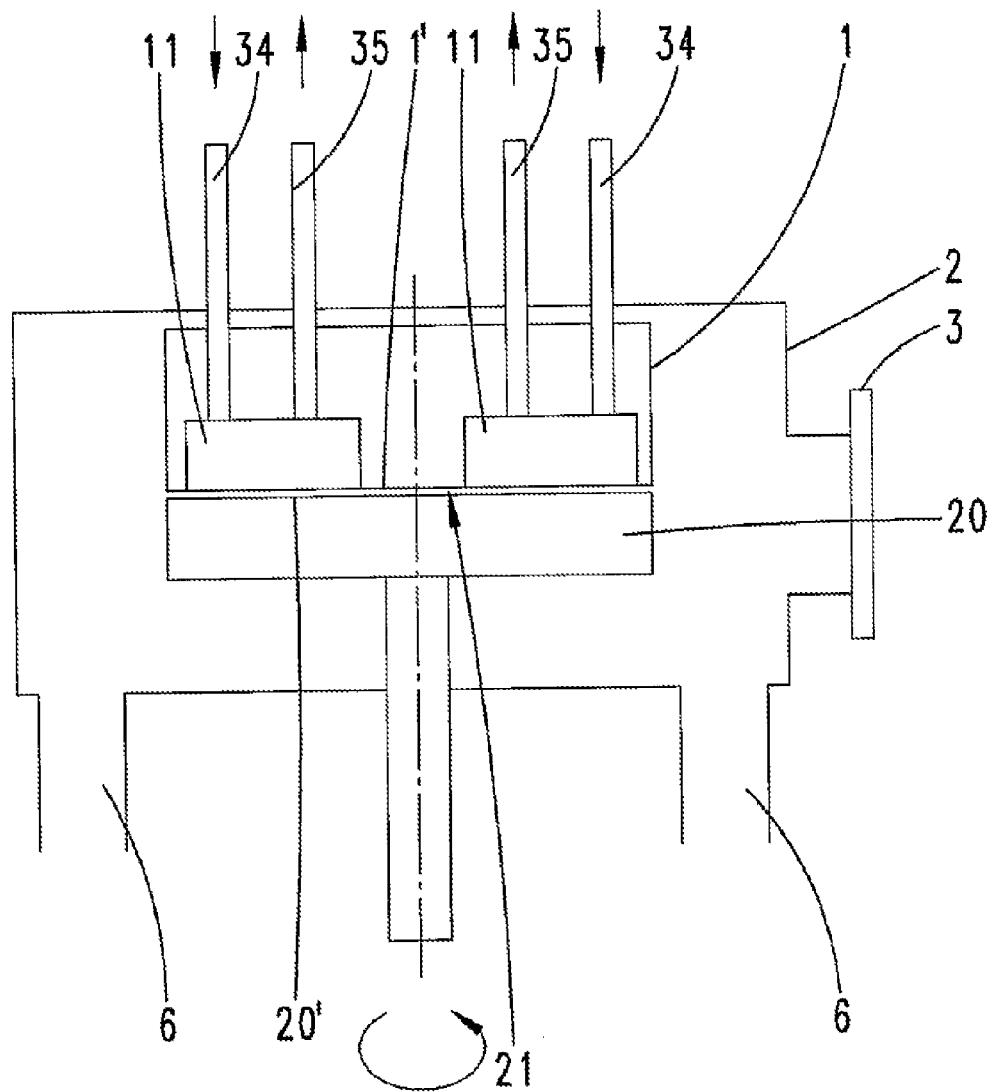
FIG. 2 shows a roughly schematic illustration of a cross-section through an apparatus according to the invention.
Figure 3:
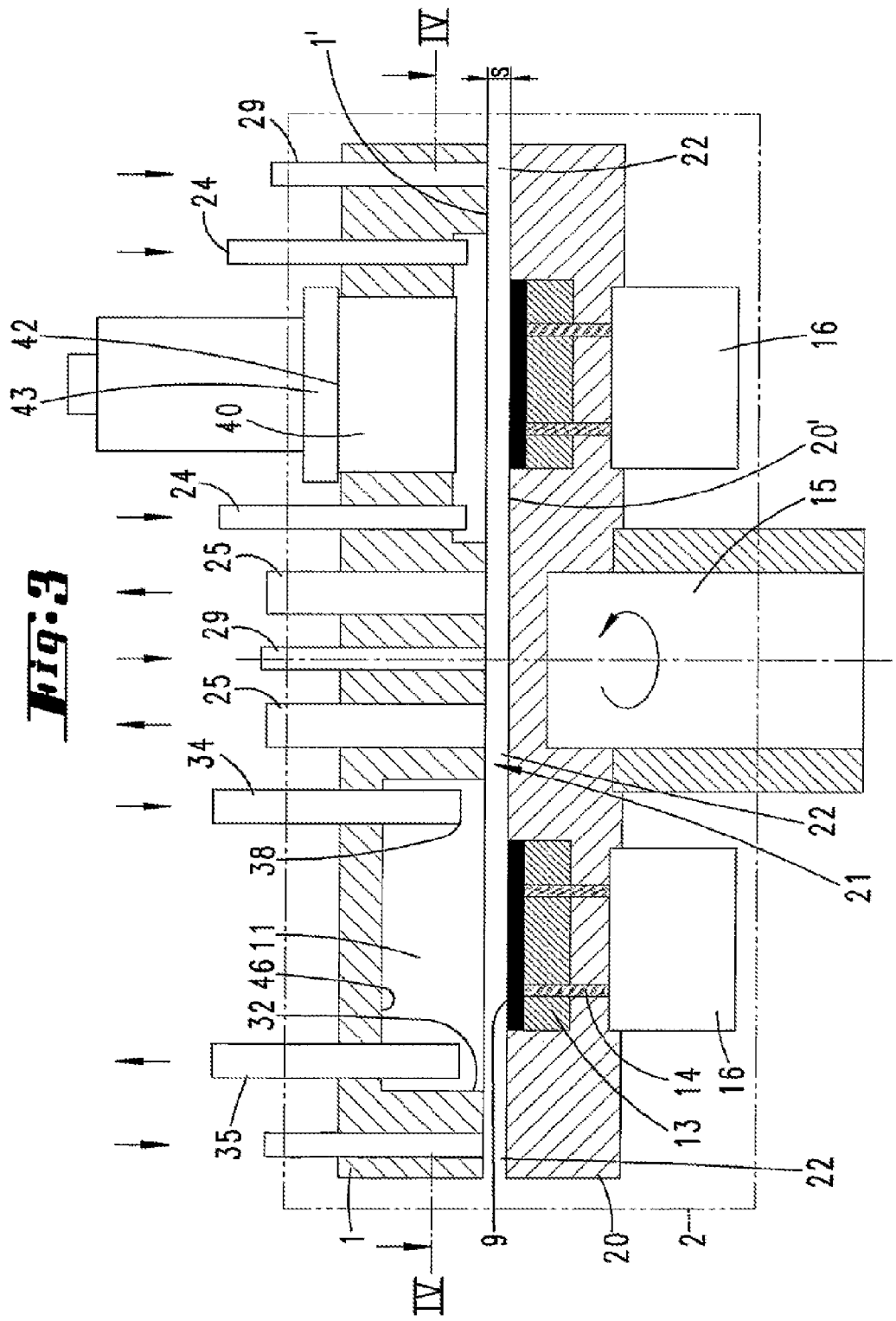
FIG. 3 shows, likewise in roughly schematic form, a cross-section through the process chamber of an apparatus according to the invention, the cross-section being taken along the section line which is designated III-III and is illustrated in FIG. 4.

A deposition-chamber body 1 is disposed within a vacuum chamber 2 and is produced, preferably from metal or quartz, with an adjacent vacuum flange 3 and a substrate loading and unloading door 4. One or more of these chambers 2 may be associated with an external loading door 8 of a substrate loading system 5. One or more separating doors 48 may be provided within the loading door 4 or the external loading door 8. The loading system 5 contains a transfer chamber with an automatic robot arm 7, which is capable of handling the substrates 9 for loading and unloading purposes.

The body designated by reference numeral 1 forms the top 1 of a process chamber and is disposed in the reactor housing 2. It has a multiplicity of deposition chambers 11 and a multiplicity of purging and pumping chambers 40. The part which is adjacent to the chambers is a movable susceptor 20 with substrate holders 13 disposed therein and with a substrate-lifting mechanism 14. The movable susceptor 20 is coupled to a horizontal drive mechanism 15 and to a vertical lifting mechanism 16. Both the chamber body 1 and the movable susceptor 20 can be heated by at least one external radiation heater or a built-in resistance heater. The chamber body 1 and susceptor 20 are preferably of circular-disk form. Other shapings however, such as a rectangular shape, are also possible.

The susceptor 20 with integrated substrate holders 13 and substrate-lifting arrangements 14 can be moved, preferably rotated, in the horizontal direction in relation to the chamber body 1, a narrow gap 21 remaining between the susceptor 20 and chamber body 1. The narrow gap 21 serves as a dynamic seal 22 in order significantly to avoid the mixing of gases in the deposition chambers 11, 11' and/or the pumping or purging chambers 40, so that the gases can be delivered to the substrates independently of one another. The gap is purged by means of compressed inert gas which is introduced through an inlet channel 24 and is removed through an outlet channel 25, at reduced pressure. The thickness s of the gap 21 is selected such that minimal gas streams can pass out of the deposition chambers 11, 11'. The substrate 9 may be placed in a depression, so that it preferably has its surface aligned with the surface 20' of the substrate holder 20. The controlled pressure within the gas gap may be slightly greater than the process pressure within the deposition chamber 11 and significantly higher than the pressure within the adjacent pumping and purging chamber 40.

The gas gap, located in the center of the chamber body 1, isolates the chambers 11, 11' and 40 from the rotation or translation mechanism.

A multiplicity of deposition chambers 11, 11' and pumping and purging chambers 40 are disposed within the chamber body 1. Each of these chambers is separated from the others in each case by a narrow gap 21 filled with an inert gas.

Each of the suitable and preferably cup-like or box-like deposition chambers 11, 11' has a base surface 46 and at least three or four preferably vertically oriented side walls 32. Provided adjacent to the deposition chambers 11, 11' in the chamber body 1 are one or more infeed channels 34 for one or more reactive gases, these channels opening out into the chamber by way of suitable endpieces 38, for example nozzles. These infeed channels 34 are connected to external reactive-gas lines or to a vacuum system and to a gas mixing system. In order to generate a pressure within the deposition chambers 11, 11' which is appropriate for a suitable MOCVD, ALD etc. process, the gas is removed through outlet channels 35. All the outlet channels 35 are connected to a main vacuum line and a vacuum pump.

A number of purging-gas-inlet channels 24 and purging-gas-outlet channels are provided for the purging chambers 40. In a differently configured exemplary embodiment, the upper part of a purging chamber 40 has an opening 42 for an inlet flange 43 of a pump, preferably a turbopump.

A portion of a movable susceptor 20 is adjacent to each deposition chamber 11, 11' or purging chamber 40. The susceptor 20 may carry a substrate 9 which is disposed on a substrate holder 13, which preferably has an "electrostatic chuck", that is to say an electrostatic substrate mount. This substrate holder may be provided with lifting pins 14 of a lifting mechanism 16.

Figure 4:
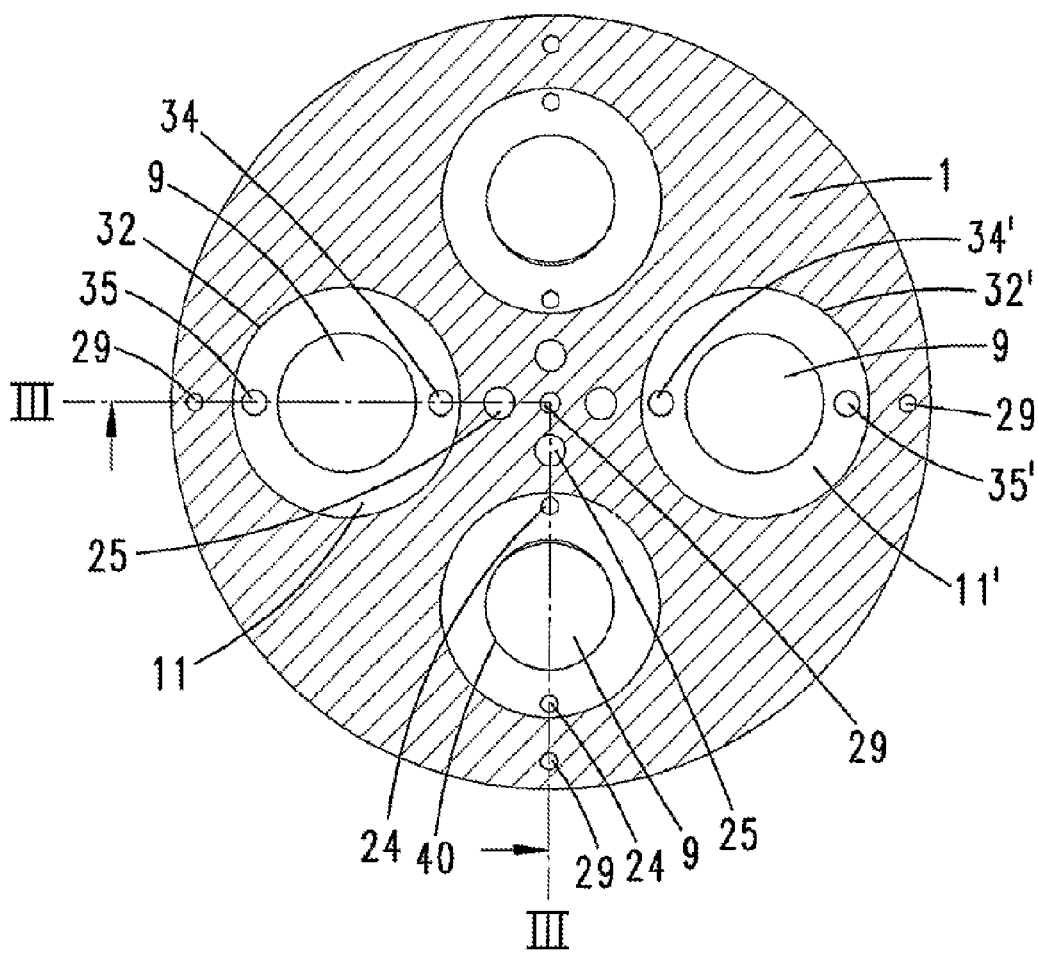
FIG. 4 shows a section along line IV-IV in FIG. 3, through a process chamber top, which forms the chamber-carrying body.
Figure 6:
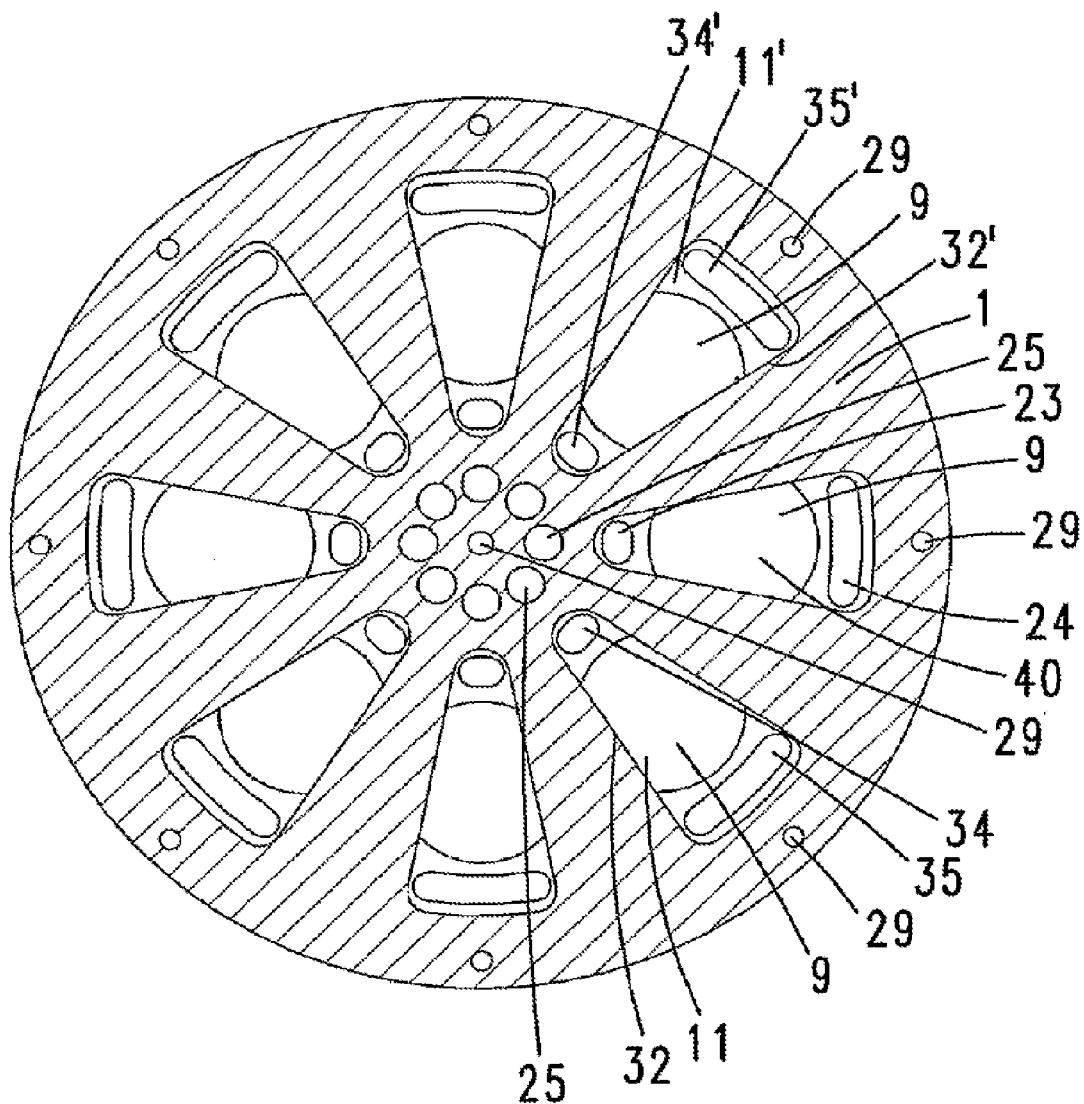
FIG. 6 shows a section like that in FIG. 4 for a further exemplary embodiment.

It can be gathered from the sectional illustration according to FIG. 4 that two different deposition chambers 11, 11' are provided in this exemplary embodiment. Each of these deposition chambers has a circular outline here. However, the outline may also be configured differently, as, for example, FIG. 6 shows. It is also possible in principle, for the outline of a deposition chamber 11, 11' and/or of the purging chambers 40 located between the two deposition chambers 11, 11' to be rectangular, in particular, square.

In the case of the exemplary embodiment which is illustrated in FIG. 4, a total of four substrates rest on the susceptor. In preferred configurations which are not illustrated, considerably more, in particular at least six, substrates rest on the susceptor in an annular arrangement about the center of the susceptor. Each of the plurality of substrate holders may be assigned a deposition chamber 11, 11' and/or a purging chamber 40, so that in a certain rotary position of the susceptor, each substrate 9 is located beneath a deposition chamber 11, 11' or beneath a purging chamber 40. In the case of such a configuration in which the outline of the individual chambers 11, 11', 40 is larger than the outline of a substrate 9, the susceptor may be rotated in stepwise operation. It is rotated on at regular intervals and, in rotary positions in which each substrate 9 is associated with a chamber 11, 11', 40, is stopped for a certain period of time, during which time it is possible for the chamber-specific processes to take place on the surface of the substrate 9.

Figure 5:
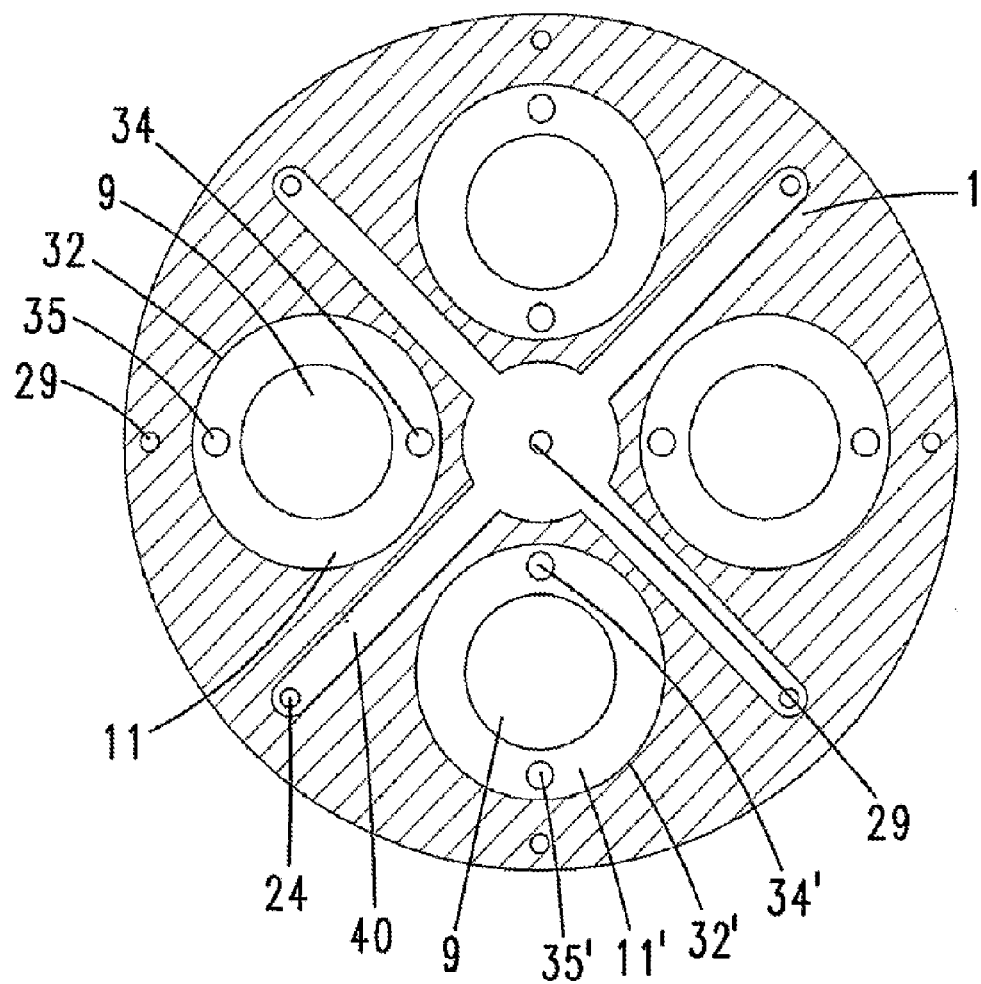
FIG. 5 shows a section like that in FIG. 4 for a further exemplary embodiment.

In the case of the exemplary embodiment which is illustrated in FIG. 5, the deposition chambers 11, 11' have outlines which are larger than the outlines of the substrates 9, so that this apparatus can also be operated in a stepwise manner. In contrast to the apparatus illustrated in FIG. 4, however, the purging chambers 40 here are of considerably narrower configuration. They serve substantially for generating a gas seal between the individual deposition chambers 11, 11', so that the different process gases of the individual deposition chambers 11, 11' do not mix. The purging chamber 40 here has a substantially cross-like structure. The gas inlet for the purging gas 29 may be disposed, for example, in the center here. It is also possible, however, for the purging gas to be introduced into the purging chamber 40 through the inlet 24, which is located at the radially outer end of the respective purging chamber 40. As an alternative, however, it is also possible for each of the two channels 24, 29 to be used as outlet, so that the purging gas can flow through the purging chamber 40 in the radial direction.

It is also the case in this exemplary embodiment that each of the four different deposition chambers 11, 11' has an infeed channel 34, 34' through which the individual process gas is introduced into the deposition chambers 11, 11'. It is also the case here that the shaping of the cross-section of the infeed channel 34, 34' is only indicated. A special shaping may be provided here in order to ensure homogenous gas-phase distribution within the deposition chambers 11, 11'. The same applies to the shaping of the respective outlet channel 35, 35'. The flows through these two channels 34, 34'; 35, 35' are set such that as little gas as possible enters into the gap 21 and no purging gas penetrates through the gap 21 into the deposition chamber 11, 11' by way of the nozzles 29, 35.

The above-described arrangements can be used for depositing different types of thin layers on substrates in a CVD process (for example MOCVD or ALD or the like). Both continuous and batchwise operation are possible.

In a typical process sequence, the susceptor 20 is moved, in particular rotated into a loading position for a first substrate holder 13. The susceptor 20 stops when the first substrate holder 13 is positioned in front of the loading door 4. The lifting pins 14 are then raised. The gas-separating door 48 opens. A robot arm 7 carrying a substrate 9 then enters into the first cavity 11 and places the substrate 9 on the pins 14 above the substrate holder 13. These pins are lowered by means of the lifting mechanism 16, so that the substrate rests on the holder 13. The substrate holder 13 is preferably an electrostatic substrate holder. However, it may also have mechanical clamping means for the substrate.

The susceptor 20 is then moved into a further loading position for the next substrate holder 13 in relation to the robot arm 7. Once the abovementioned steps have been repeated for all the substrate holders 13, loading has been completed. The separating door 48 closes and the empty robot arm 7 moves back into a neutral position. This type of loading operation described relates to the batchwise method. The continuous method requires an alternative loading/unloading operation, which is referred to as "hot swap of substrates". In this case, the already processed substrate is removed from the robot arm and a blank substrate is positioned on the empty substrate holder. A high-speed twin-arm robot is preferably used for this purpose.

At the start of rotation of the susceptor 20 with the substrate holder 13, the substrates enter into a deposition chamber 11 at a certain point in time. The temperature of the chamber and the substrate temperature within the chamber 11 are kept constant and are adapted to the desired chemical reaction within the chamber. Within the chamber 11, there is a constant, preferably horizontally running flow of reactive gases or vapors between the inlet nozzle 34 and the outlet opening 35. This gas flow is maintained continuously. The reactive gas or the reactive vapor forms a thin layer of material on that surface of the substrate which is oriented toward the deposition chamber 11. As soon as the desired film or the desired surface coating has been achieved, the substrate leaves the deposition chamber 11 and moves to a pumping/purging chamber 40 and/or to the next deposition chamber 11'.

In order to isolate the adjacent chambers 11 from one another and from the vacuum region 2 which encloses the deposition chamber body, a multiplicity of dynamic sealing regions 22 are provided. These act as a narrow gap 21 between the chamber body 1 and susceptor 20. This gap is purged continuously by an inert gas. The inert gas is delivered through the channels 29. A suitable pressure gradient is maintained between the gap, the chambers and the interior of the vacuum recipient. The gap forms a dynamic vacuum seal which prevents reactive gases from flowing between the different cavities 11 and the cavity of the vacuum recipient outside the reactor body 1.

In the case of the exemplary embodiment which is illustrated in FIG. 6, the outline of the purging chambers 40 and/or of the different deposition chambers 11, 11' is smaller, as seen in the circumferential direction, than the diameter of the circular-disk-form substrates 9. This apparatus allows continuous rotation of the susceptor 20. The outline of the deposition chambers 11, 11' and/or of the purging chambers 40 is selected such that each point of the substrate has an equal residence time within the purging chamber 40 and/or the deposition chambers 11, 11'. The outline is of circular-segment form in particular.

In order to generate the process gases which are to be introduced into the deposition chambers, use may be made, for example, of a vaporizer as described in EP 1 098 015 A1, for which reason the disclosure content of said document is also included in full in the disclosure content of this application.

However, the apparatus described in EP 1 320 636 A1 is also a suitable vaporizer, for which reason said document is also included in full in the disclosure content of this application.

Finally, provision is also made for the vaporization of liquid precursors, or precursors dissolved in a liquid, to take place in an apparatus, and using a method, as described in DE 100 57 491 A1, for which reason, the disclosure content of said document is also included in full in the disclosure content of this application.

All features disclosed are (in themselves) pertinent to the invention. The disclosure content of the associated/attached priority documents (copy of the prior application) is hereby also included in full in the disclosure of the application, also for the purpose of incorporating features of these documents in claims of the present application.

What is claimed is:
1. A method, comprising:
positioning a substrate such that a surface of the substrate faces a first one of a plurality of cavities of a chamber body, the plurality of cavities of the chamber body being separate from one another;
delivering a first process gas into the first cavity via an inlet disposed in a wall of the first cavity and evacuating the first process gas from the first cavity via an outlet disposed in the wall of the first cavity so as to deposit a first layer on the substrate;

positioning the substrate such that the surface of the substrate faces a second one of the plurality of cavities of the chamber body;

delivering a purge gas into the second cavity via an inlet disposed in a wall of the second cavity and evacuating the purge gas from the second cavity via an outlet disposed in the wall of the second cavity; and delivering an inert gas into a gap between a first surface of the chamber body and a first surface of a susceptor, the first surface of the chamber body and the first surface of the susceptor being parallel to one another, so as to (i) prevent the first process gas in the first cavity from entering the second cavity through the gap, and (ii) prevent the purge gas in the second cavity from entering the first cavity through the gap.

2. The method of claim 1, further comprising:

positioning the substrate such that the surface of the substrate faces a third one of the plurality of cavities of the chamber body; and delivering a second process gas into the third cavity via an inlet disposed in a wall of the third cavity and evacuating the second process gas from the third cavity via an outlet disposed in the wall of the third cavity so as to deposit a second layer on the substrate.

3. The method of claim 1, wherein the substrate is disposed on a substrate holder, and the substrate holder is disposed in a cavity of the susceptor.

4. The method of claim 3, wherein the surface of the substrate is positioned to face the first cavity by rotating the susceptor.

5. The method of claim 4, wherein the first process gas flows from the inlet to the outlet of the first cavity in a direction perpendicular to a path traversed by the substrate.

6. The method of claim 1, wherein the plurality of cavities of the chamber body are disposed in the first surface of the chamber body.

7. The method of claim 1, wherein while the surface of the substrate faces the first cavity, the surface of the substrate does not directly face the inlet of the first cavity.

8. The method of claim 1, wherein while the surface of the substrate faces the first cavity, the surface of the substrate does not directly face the outlet of the first cavity.

9. The method of claim 1, wherein the inert gas is delivered into the gap via an inlet disposed on the first surface of the chamber body.

10. The method of claim 1, wherein the inert gas is evacuated from the gap via an outlet disposed on the first surface of the chamber body.

* * * * *